June 2, 1970 G. A. MAY 3,515,899
LOGIC GATE WITH STORED CHARGE CARRIER LEAKAGE PATH
Filed June 8, 1966 3 Sheets-Sheet 1

INVENTOR
GEORGE A. MAY
BY Curphey & Erickson
PATENT AGENTS

INVENTOR
GEORGE A. MAY
BY Curphey + Erickson
PATENT AGENTS

INVENTOR
GEORGE A. MAY
BY Curphey & Erickson
PATENT AGENTS

United States Patent Office 3,515,899
Patented June 2, 1970

3,515,899
LOGIC GATE WITH STORED CHARGE CARRIER LEAKAGE PATH

George A. May, Ottawa, Ontario, Canada, assignor to Northern Electric Company Limited, Montreal, Quebec, Canada Filed June 8, 1966, Ser. No. 556,050
Int. Cl. H03k *19/36*
U.S. Cl. 307—215 17 Claims

ABSTRACT OF THE DISCLOSURE

A high speed NAND gate having an AND stage, inverter stage, and clamping means, with a low impedance leakage path from the clamping means and base of a transistor in the inverter stage to a neutral potential point, so as to allow the stored charge carriers in said base and clamping means to be rapidly dissipated, providing a substantially reduced shut-off time for the gate.

This invention relates to the field of electronic logic gates, and particularly to those utilizing a combination of transistors and diodes.

Logic circuits comprsing combinations of semiconductor diodes and transistors have gained wide acceptance as the basic elements in digital computers, switching circuits, and other decision-making apparatus. A discussion of different types of these logic circuits may be found in "Electronics" magazine, Mar. 15, 1963, pp. 68 to 74 inclusive, entitled "High-Speed Integrated Circuit With Load-Compensated Diode-Transistor Logic."

Figure 1:
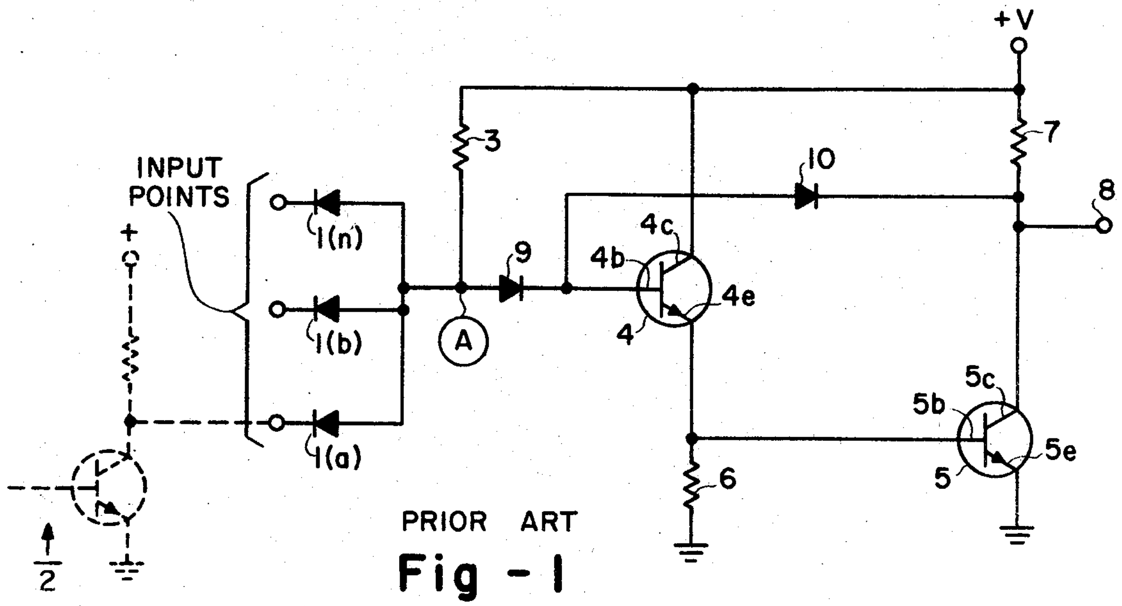

One type of diode-transistor logic circuit which has gained wide acceptance may be found in FIG. 1(D) of the aforemetnioned article, and is reproduced for convenience in FIG. 1 herein. This logic circuit consists of a buffered AND input stage, and a diode-transistor inverter stage comprising a potential level-shifting diode connected to the input of a transistor current amplifying stage. In order to minimize saturation of the inverting transistor in the transistor stage during its operation, a clamping diode is connected around the transistors in order to hold the inverting transistor to an operating level less than at saturation.

In the past, it was found that such a circuit operated at a reasonable speed, it was relatively reliable since there was a certain amount of protection against operation by spurious noise, and was reasonably easy to fabricate in microcircuit form.

However, with the electronic switching art advancing and requiring much higher logic circuit switching speeds than previously, this circuit was found to be no longer adequate. When the inverter stage is shut off, minority charge carriers stored in the clamping diode and majority charge carriers stored in the base of the input transistor as well as in stray capacitance at their junction can keep the transistors in the inverter stage in operation until they leak to a point of neutral potential, if they are greater than the charges stored in the level-shifting diode. The inverter stage will remain in operation until the potential at the base of the input transistor is less than that required to the forward bias the two transistors. Since the forward bias of the level-changing diode is then removed, leakage could only be achieved through high impedance "off" elements and the emitter follower stage, and therefore due to the resulting long time constant the turn-off time of the circuit is relatively slow.

In order to overcome this problem, microcircuit fabricators have resorted to gold doping of the clamping diode and transistors in order to reduce minority carrier lifetime, and therefore effectively have less ability to store such carriers. Unfortunately, gold doping substantially degraded the p-n junction breakdown characteristic of the diodes and transistors while increasing the cost of each circuit due to extra steps being required during fabrication, and substantially reduced production yield. In order to increase the production yield when using the gold doping processes, many fabricators resorted to manufacturing these circuits in discrete component form rather than using microcircuit design, with resulting increase in cost due to the required manual assembly of the circuit.

I have invented a diode-transistor logic circuit which may be made in microcircuit form, does not require gold doping, achieves increased switching speed over the prior art form of such circuits, can be made in a form having high reliability of performance, and costs in the same order of magnitude as conventional microcircuits.

In order to achieve these advantages, I have invented a logic circuit inverter stage which comprises an input terminal, a first transistor means having an input electrode which is connected to the input terminal, an output terminal, a second transistor means having an output electrode which is connected to the output terminal, means for applying operating potential to the inverter circuit, level shifting means connecting the first transistor means to the second transistor means to form a first series circuit having a predetermined conduction threshold, and clamping means connecting the input terminal to the output terminal for maintaining the second transistor means at a predetermined operating point while it is conducting.

The particular configuration of these elements, as will be explained below, allows a low impedance leakage path from the clamping diode and the base of the first amplifying transistor to a neutral potential point, when the inverter stage has been turned off. Since gold doping is not required, the circuit of my invention can be made with normal production yields by the usual microcircuit techniques, which allows advantages in size and cost as well as ease of fabrication. Thus, there is no degradation of the operating characteristics of any of the elements. As will be explained with reference to further embodiments of my invention, the circuit can be made relatively insensitive to false operation due to noise. The propagation delay of the circuit is greatly reduced due to the virtual elimination of the problem of minority charge carriers holding the circuit operated for a significant amount of time after it has been turned off.

Figure 2:
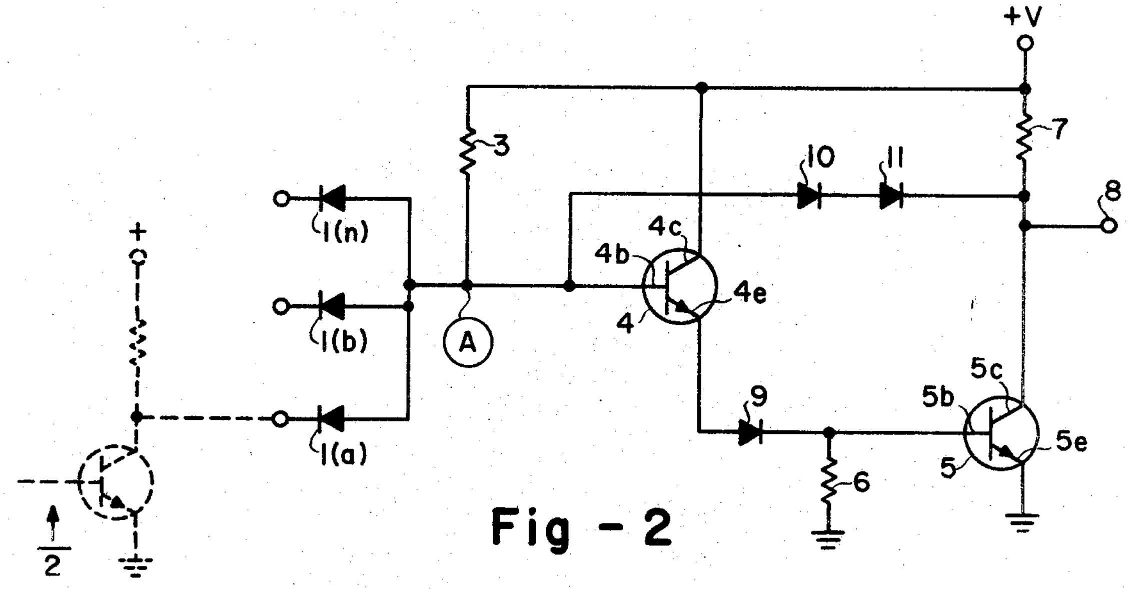
Figure 3:
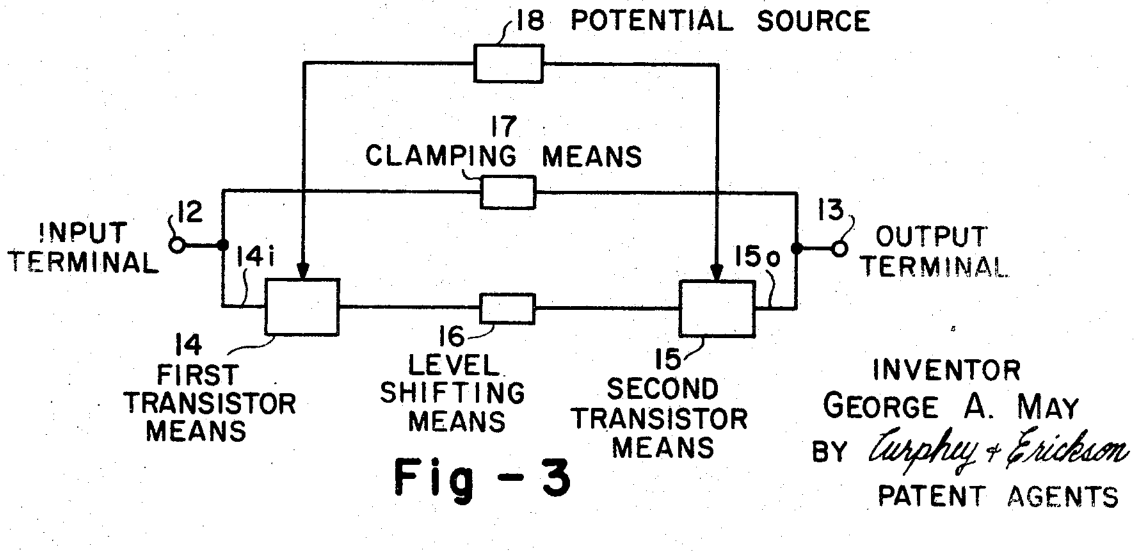
Figure 4:
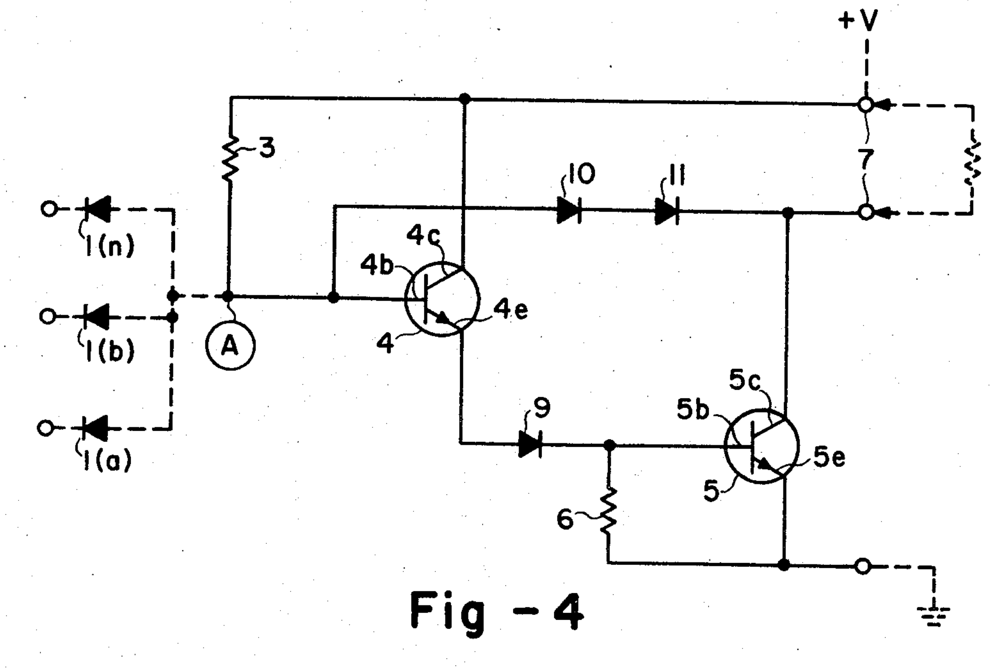
Figure 5:
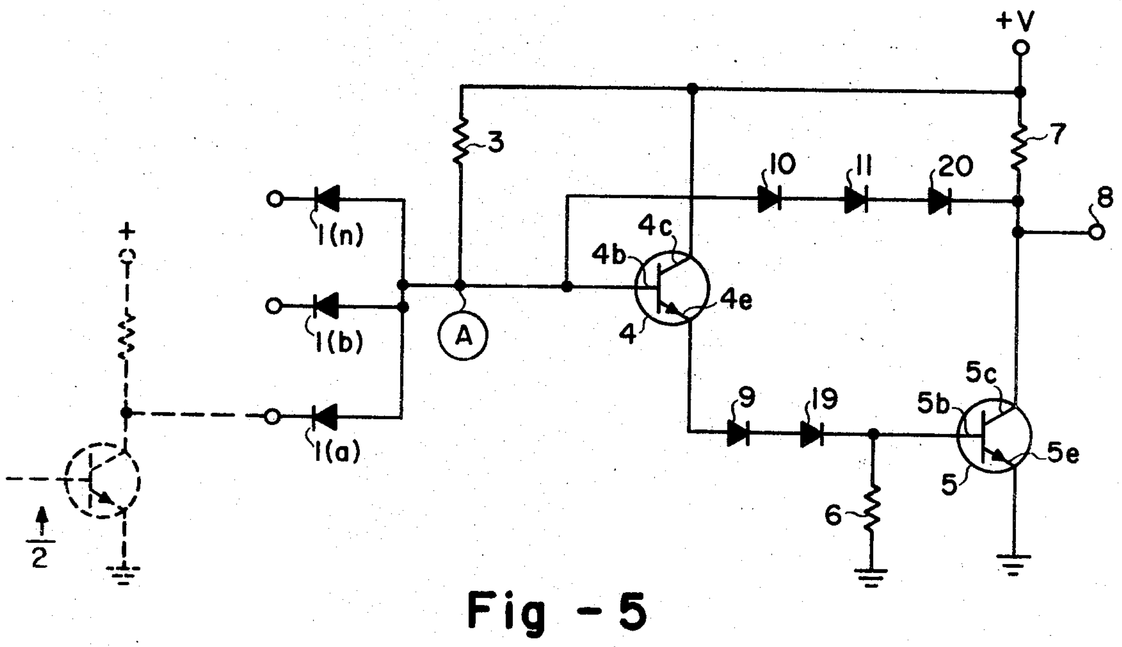
Figure 6:
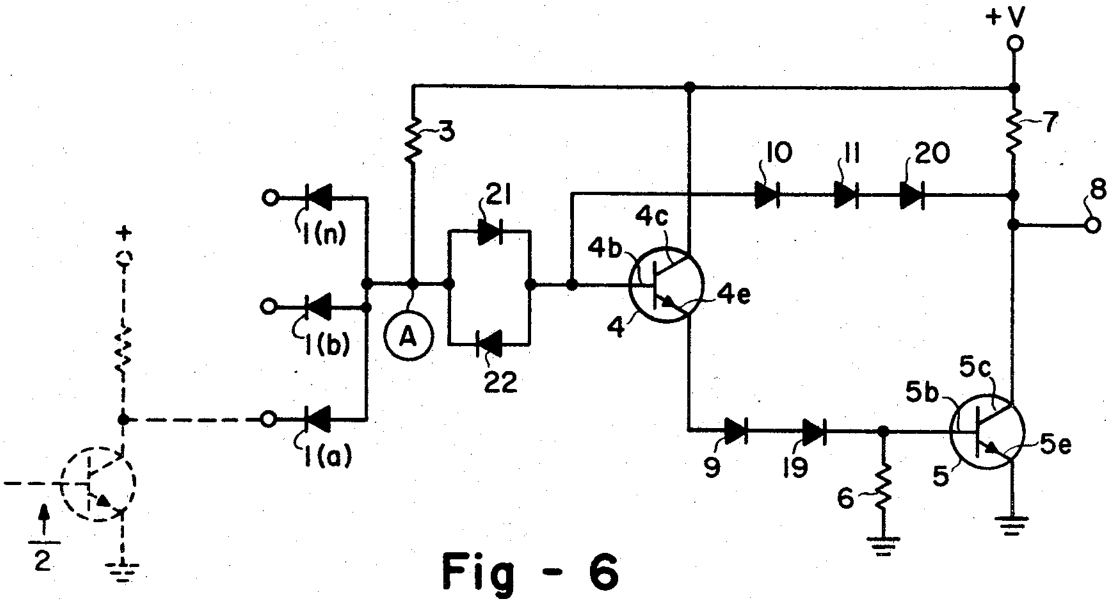
Figure 7:
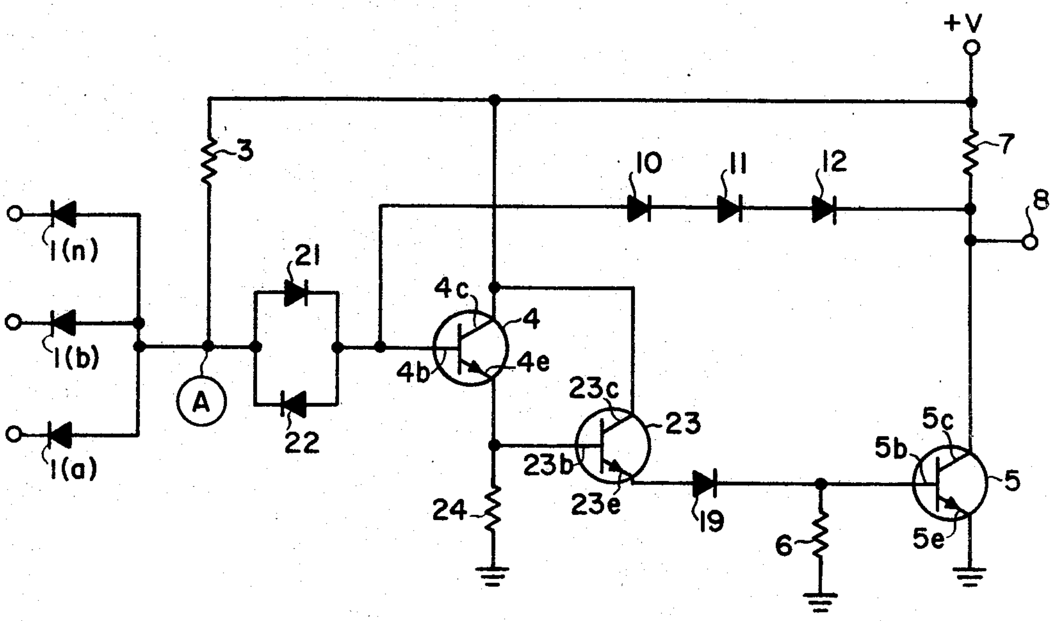

A better understanding of my invention may be obtained by a consideration of the more detailed discussion below with reference to the following drawings:

FIG. 1 is a schematic diagram of a NAND logic gate according to the prior art,

FIG. 2 is a schematic diagram of the first embodiment of my invention, in the form of a NAND logic circuit, FIG. 3 is a block diagram of my invention showing the essential elements of my invention in broad terms, FIG. 4 is a schematic diagram of the first embodiment of my invention in a form in which it may be manufactured using microcircuit techniques, FIG. 5 is a schematic diagram of a second embodiment of my invention, including means for increasing the noise immunity thereof, FIG. 6 is a schematic diagram of a third embodiment of my invention showing further means for increasing the noise immunity of my invention when further additions to the circuit using the technique of my second embodiment becomes difficult or uneconomical, and FIG. 7 is a schematic diagram of a fourth embodiment of my invention, including means for obtaining a larger current amplification in the inverter stage while maintaining high noise immunity.

FIG. 1 shows a logic circuit which is well-known in the prior art and functions as a negative-AND or NAND circuit. As an aid to understanding my invention, a detailed discussion of that circuit will be given below. If any of the input points has a (negative, in this case) signal connected to it, there will be no output. In other words, all of the input points must be positive or unconnected in order for an output from the circuit to appear. Conversely, it may be said that this type of circuit is an OR circuit, since negative potential at any one of the input points will cause no output from the circuit. The general classification of this type of circuit is sometimes called a "gate" and will be referred to as such in this disclosure. The principles of this invention may be extended to other types of gates once it is understood, but the description herein will relate to a NAND gate.

The type of gate shown in FIG. 1 consists of two stages, one which will be defined as the AND stage, to the left of point A in the schematic, and the second stage which is called the inverter stage, generally found to the right of point A. The AND stage performs the AND function and isolates the inverter stage from a previous gate, which may be of the same type, while isolating various previous gates from each other when they are all connected to point A at the inverter stage. The inverter stage, among other things, inverts the form of the input to a particular type of output as discussed above. A discussion of advantages of this type of circuit may be found in U.S. Pat. 3,217,181, issued to B. Zuk, issued Nov. 9, 1965.

It may be seen that if a negative input pulse or switch to ground is applied to the AND stage, the inverter stage causes a positive going output pulse with respect to ground to appear at its output. However, when the AND stage is released from conducting by means of the presence of a positive input pulse, or similar removal of AND stage from connection to ground, the inverter stage begins conduction and provides a negative going output signal towards ground. In other words, it may be considered that the absence of a positive input signal causes a positive output signal to appear, while the presence of a positive input causes a negative going output signal to appear.

Considering the circuit, it may be seen that the AND stage comprises various AND input diodes 1($a$), 1($b$), to 1($n$). Usually the input diodes are connected via a previous stage output transistor circuit 2, shown dotted to ground. Therefore, with the previous stage 2 conducting, the cathode of input diode 1($a$) will be connected through to ground. Point A is connected via resistor 3 to a source of positive voltage. Diode 1($a$) will become forward biased when previous stage 2 is conducting, and therefore it may be seen that the purpose of the AND stage is to effectively connect point A to ground. However, it is important to realize here that point A will actually be positive from ground by the value of the base-emitter voltage drop of the output transistor of previous stage 2, plus the cathode-anode voltage drop (herein referred to as the threshold voltage) of diode 1($a$). Point A is thus held at about 2 diode threshold voltage values above ground.

When previous stage 2 ceases conduction, there is effectively no conduction path from point A to ground through diode 1($a$) and it stops conducting since it is not forward biased any longer. Therefore, point A quickly begins rising in potential towards the value +V volts.

The above-described function of the AND stage is identical to the one which may be used with my invention, and thus this will suffice as explanation of its function, except where it directly affects the operation of my invention.

Further considering the prior art circuit of FIG. 1, it may be seen that the inverter stage comprises emitter follower transistor 4 and inverter transistor 5. The emitter follower transistor 4 comprises base electrode 4$b$, collector electrode 4$c$ and emitter electrode 4$e$, while the inverter transistor 5 comprises base electrode 5$b$, collector electrode 5$c$ and emitter electrode 5$e$. Resistor 6 and base 5$b$ are each connected to emitter 4$e$ of transistor 4, allowing transistor 5 and resistor 6 to operate as a load on transistor 4. The other terminal of resistor 6 and emitter 5$e$ are both connected to ground. A source of operating potential for the inverter stage is connected to collector electrode 4$c$, through resistor 3 to point A and through load resistor 7 to collector electrode 5$c$. An output signal is obtained at output terminal 8. Level shifting diode 9 is connected between point A and base electrode 4$b$.

It is well known by those skilled in the art that a model of a transistor may be considered as consisting of two diode junctions; the base emitter junction, and the base-collector junction. As in a normal semiconductor diode, the junctions have a threshold of conduction which must be overcome before they will conduct. In this gate the transistors 4 and 5 are connected such that their base-emitter junctions are in the same direction, i.e., the direction of current flow for minimum biasing potential, or the direction of easy current flow, is in the same direction. Therefore, the transistors should be of the same conductivity type, either NPN or PNP. In the circuits shown in this application, the transistors are NPN, but PNP may also be used provided the other diodes, the source of potential and the input signal are all reversed in polarity. It is important that diode 9 also be connected in the direction of easy current flow with respect to the base-emitter diodes of the transistors 4 and 5. It is also important to note that the input diodes, i.e., 1($a$) and diode 9 must have their similar terminals connected to point A.

It may be seen that in the inverter stage of this gate, the equivalent of at least 3 diode junction potential drops must exist between point A and ground in order that the inverter stage become forward biased and therefore begin conducting and operating. The three diode junction potential drops are that of diode 9, diode 4$b$–4$e$, and diode 5$b$–5$e$. It is assumed for this discussion that the semiconductor materials making up the transistors and diodes are the same, for instance all of silicon or all of germanium, which would, therefore provide equivalent potential drops in the diodes or transistor diode junctions.

However, it may be seen that when the input diode 1($a$) is conducting, point A is held (or clamped to) only 2 diode junction potential drops above ground, since for this discussion it is connected to the output of a gate similar to itself. Therefore, the inverter stage is held below its conduction threshold and cannot operate. All elements are therefore in their high impedance state. Previous stage 2 ceases conduction and point A is allowed to rise in potential, the three diode junctions of the inverter stage become forward biased and therefore conduct. Since now output transistor 5 conducts, an output signal may be obtained at output terminal 8.

At this point it may be seen that noise may be generated in the previous stage 2, but as long as the point A does not rise above 3 diode threshold potential drops from ground, the inverter stage will not operate. Therefore, noise potential of the order of the difference between the diode threshold potential drops, i.e., 3—2=1 diode threshold potential drop (or approximately .7 volt for silicon) may be tolerated at point A before the inverter stage will begin response thereto. It may be seen that additional noise immunity may be obtained by adding diodes in series with level shifting diode 9 in order to increase the number of junction potential drops between point A and ground through the inverter stage.

In order that transistor 5 be kept out of its saturation operation region, a clamp diode 10 is often connected between the collector 5$c$ and base 4$b$. The operation of this clamp diode is explained in the aforementioned article in "Electronics" magazine. Transistor 5 is driven into its saturation operating region if allowed to operate normally. However, clamp diode 10 connected between base electrode 4*b* and colletcor electrode 5*c* forces a potential drop therebetween of only 1 diode junction potential drop keeping base 5*b* at approximately the same potential as collector 5*c*, and the transistor 5 is held at a point somewhat less than at saturation. Since it normally takes an undesirable amount of time for the transistor to unsaturate after being in the saturation region of operation, a rapid turn-off of the inverter stage has been found to be difficult to obtain without the use of clamp diode 10.

However, with the evolvement of the switching art into a much higher order magnitude of switching speed, it has been found very difficult to use this gate at modern desirably high switching speeds. As explained above, charge carriers are stored in the clamp diode 10 as well as in the base 4*b* of transistor 4 and stray capacitance which must be conducted to ground or neutral potential before the inverter stage can turn off. Since when the input diodes are connected to ground the inverter stage active elements including level shifting diode 9 are all reverse biased, they are of high impedance. Leakage must therefore occur through the high impedance path of level shifting diode 9, and through the base-emitter junction 4*b*–4*e* which results in a relatively slow turn-off speed of the inverter stage, for instance giving rise to propagation delays of about 50 nanoseconds.

As discussed above, fabricators have resorted to gold doping in order to decrease the quantity of charge carriers. However, this introduces the degradition of characteristics, and other problems previously described. Propagation delays of about 20 nanoseconds using these techniques have been achieved.

However, in my invention, I do not require gold doping since a low impedance path is provided to ground for the minority charge carriers which exist in the clamp diode and majority charge carriers which exist in base of transistor 4. Since there is a low impedance path to ground for these carriers, they leak off quickly and the inverter stage shuts off very rapidly, resulting in a propagation delay of about 10 nanoseconds in a discrete component form of my circuit.

FIG. 2 shows a schematic of a NAND gate utilizing one embodiment of my invention. The AND stage is similar to that of the prior art, and is connected to point A. A resistor 3 is connected to +V operating potential from point A. However, I do not include level shifting diode 9 between point A and the base 4*b* of transistor 4 as in the prior art but have a direct connection instead. Level shifting diode 9 is connected between the emitter 4*e* of transistor 4 and the base 56 of transistor 5.

The point A is defined here as the input terminal to the inverter circuit. A transistor 4 having base electrode 4*b*, collector electrode 4*c*, and emitter electrode 4*e* has base 4*b* connected to the input terminal point A. The output terminal for the inverter stage is designated as 8. An inverting transistor 5 having base electrode 5*b*, collector electrode 5*c*, and emitter electrode 5*e* has collector electrode 5*c* connected to the output terminal 8. A level shifting means, diode 9, is connected between emiter 4*e* and base 5*b*. The transistors are of the same conductivity type, shown here as NPN, and the diode forward direction, or direction of easy current flow, is connected in the same sense as the base-emitter diode junctions of transistors 4 and 5, to form a first series circuit.

It therefore can be seen that there are three diode junction drops, 5*b*–5*e*, diode 9, and 4*b*–4*e* between ground and point A through the inverter stage while there are two diode junction drops between point A and ground in the AND stage and through the previous stage 2. Thus, so far the general function of the switching mode of the gate seems similar to that described with respect to FIG. 1.

However, it may be seen that between the base of transistor 4 and the base of transistor 5 there are now two diode junction drops, 4*b*–4*e* and diode 9. In order to preserve a clamped potential difference between collector electrode 5*c* and base 5*b* of approximately zero, clamp diode 10 is connected in series with a second clamp diode 11 between base electrode 4*b* and output terminal 8 to which is connected collector electrode 5*c*. Thus as there is now two diode potential junction drops between base 4*b* and collector 5*c*, base 5*b* is held at substantially the same potential as collector 5*c*. Saturation of transistor 5 is thus effectively avoided, since junction 5*b*–5*c* is not allowed to be forward biased.

With the aforementioned circuit change from the prior art, the actual operation of the circuit is radically changed during the turn-off period. When previous stage 2 conducts, forward biasing input diode 1(*a*), point A is connected to ground through a very low impedance conduction path. Minority charge carriers which are stored in clamp diodes 10 and 11 during conduction thereof, and majority charge carriers in the base of transistor 4 during its conduction, appearing at point A, now are presented with a low impedance path to ground, which virtually immediately eliminates them from the inverter stage. The inverter stage therefore has virtually no charge carriers stored therein to keep it in operation and it virtually immediately ceases conduction. The rapid shutting off of the stage allows it to be used in an extremely fast-acting gate. Operating potential may be applied to the inverter stage from +V to collector 4*c*, through load resistor 7 to collector 5*c*, and to resistor 3.

The basic structure of my invention may therefore be seen to consist in the arrangement shown in block diagram in FIG. 3. The logic inverter circuit compirses an input terminal 12, an output terminal 13, a first transistor means 14 (which may be a transistor connected in emitter follower configuration) which has an input electrode 14*i* connected to the input terminal to the stage 12, and a second transistor means 15 (which may be an inverting transistor which has an output electrode 15*o*) connected to output terminal 13. A level shifting means 16 (which may be for example a diode or a series thereof, or a transistor and diode in series) interconnects first transistor means 14 and second transistor means 15. A clamping means 17 for maintaining the transistor means 15 out of its saturation operating region is connected between the output electrode 15*o* and the input electrode 14*i*. Means for applying operating potential, which may be connected to a potential source 18, is also connected to the inverter circuit and is indicated by the conduction paths with arrowheads.

Thus with the structure of the level shifting means 16 connected between the first transistor means 14 and the second transistor means 15, the input electrode 14*i* of the first transistor means 14 and the clamping means 17 are both connected directly to the input terminal, and both the clamping means 17 and input electrode 14*i* are afforded a low impedance path to ground via a previous stage. A previous stage including an AND gate may be made of diodes, transistors etc. in a well known manner, provided it fulfills the threshold function previously described.

FIG. 4 shows the schematic diagram of a form generally similar to the circuit of FIG. 2 in which my invention may be manufactured. As was pointed out above, any of the embodiments may be made in microcircuit form. However, since the principles of microcircuit manufacture are well known, and since this invention resides in the particular circuit which is used and thus may be made in both discrete component or mircrocircuit form, no description of the specific microcircuit layout will be given here, since the connection interrelationship of elements is similar to that shown on the schematic, and this invention does not rely on the microcircuit layout per se. In fact the microcircuit form of my invention may give slightly higher propagation delay times than the discrete component form since the interelectrode capacitance between elements may be higher.

In FIG. 4 the solid lines and figures show what elements may be made by microcircuit and the broken lines show what may be added outside. The complete circuit of FIG. 2 except for load resistor 7 and AND input diodes 1(*a*), 1(*b*), and 1(*c*) may be made on one microcircuit chip. Input diodes or transistors advantageously may also be included, but outside access to point A should be provided in order that additional input diodes or transistors may be added for a larger fan-in than allowed by the input diodes or transistors already on the chip.

Means for connecting a load to the output terminal of transistor 5 is provided at 7, to which an external load impedance may be connected. The load impedance may consist of a resistor, a transistor, or other suitable device. Operating potential for the inverter circuit, +V volts and ground, may be connected as shown, externally to the microcircuit. Thus it may be seen that a manufacturer can produce this circuit or those of my other embodiments in microcircuit form to suit a wide variety of requirements of users from the standpoint of number of inputs (fan-in), operating potential, load, and noise immunity (to be discussed below).

FIG. 5 shows the schematic diagram of a second embodiment of my invention. In this embodiment, additional noise immunity is afforded over the embodiment of FIG. 2. In order to achieve a larger difference in numbers of diode threshold drops for potential level shifting between ground and point A in the inverter stage over the AND and previous stage, a second level shifting diode 19 is connected in series with the level shifting diode 9 in the aforementioned series circuit. In the inverter stage there are therefore four diode junction potential drops between point A and ground, 4*b*–4*e*, diode 9, diode 19, and 5*b*–5*e*, while there are only two, as described previously, including the AND stage which may be connected thereto. Thus the noise immunity is 4 threshold potentials minus 2 threshold potentials, or approximately 2 threshold potentials, of the order of 1.4 volts for silicon diode junctions. If more inverter stage amplification is desired, diode 9 may be changed to a transistor, not shown in this figure.

In order to preserve the non-saturation operating levels of the inverting transistor 5, the clamping means is also modified. A third clamp diode 20 is connected in series with the first and second clamp diodes 10 and 11. Therefore between base 4*b* and output terminal 8, there are 3 diode junction potential drops through the clamp diodes 10, 11, and 20. There are similarly 3 diode junction potential drops through 4*b*–4*e*, and diodes 9 and 19, to base 5*b*. Thus 5*b* is held at about the same potential as collector 5*c*, and saturation of transistor 5 is thus avoided. As before, base 5*b* is connected through resistor 6 to ground, emitter electrode 5*e* is connected to ground, and operating potential +V may be connected via load resistor 7 to collector 5*c* and output terminal 8, to collector 4*c*, and through resistor 3 to point A. As discussed above, the load and potential (including ground) connections may be made externally, and do not necessarily make up part of the manufactured circuit.

It should be pointed out that additional noise immunity may be obtained by adding additional diodes in series with diodes 9 and 19 and compensating clamp diodes in series with diodes 10, 11 and 20. However, it has been found that as the number of level shifting diodes increases over two, fabrication techniques become more difficulit. My fourth embodiment, shown in FIG. 6 provides a circuit technique which achieves the desired goal of further increased noise immunity, while preserving ease of fabrication.

FIG. 6 shows an AND stage similar to those described above, connected to point A. Transistor 4, having base electrode 4*b*, collector electrode 4*c*, and emitter electrode 4*e*, is connected to inverting transistor 5, which has base electrode 5*b*, collector electrode 5*c*, and emitter electrode 5*e*, in a similar manner to FIG. 3, through diodes 9 and 19. Emitter electrode 5*e* is connected to ground, and resistor 6 is connected between base electrode 5*b* and ground. Clamp diodes 10, 11 and 20 connect base electrode 4*b* with collector electrode 4*c* with collector electrode 5*c*. However a third level shifting diode 21 is connected between point A and base 4*b*. This provides a total of 5 diode threshold potential drops between point A and ground through the inverter stage. However, in order to utilize the principles of my invention, a bypass diode 22 is connected in parallel, but opposite polarity relationship, with the third level shifting diode 21. That is, the anode of diode 21 is connected to the cathode of diode 22, and the cathode of diode 21 is connected to the anode of diode 22.

Resistor 3 is intended to connect point A with a source of operating potential +V, and source +V is also intended to be connected to collector 4*c* and via load resistor 7 to collector electrode 5*c*, externally to the microcircuit if desired.

To understand this embodiment of my invention we must consider three modes of operation thereof. In the first mode, considering the previous stage 2 in operation, the point A is held approximately 2 diode junction potential drops above ground. Diodes 21, 4*b*–4*e*, 9, 19, and 5*b*–5*e* require the equivalent voltage at point A of 5 diode threshold drops above ground to become forward biased. There are thus 5 junctions minus 2 junctions or three junction potential drops of noise immunity, approximately 2.1 volts for silicon semiconductors. Since diode 22 is connected in opposite sense to diode 21 and since the potential at point A is slightly positive, diode 22 is reverse biased and is thus a high impedance.

However, when previous stage 2 ceases conduction and point A begins rising in potential, the complete inverter stage with the exception of diode 22 becomes forward biased and therefore operates, allowing an output signal to be obtained at output terminal 8.

The second mode of operation is in the means for keeping transistors 5 out of its saturation operating region. Considering the number of diode junction drops between the base 4*b* of transistor 4 and output terminal 8, it may be seen that the conduction path through the clamping diodes 10, 11 and 20 provides a clamp equivalent to three diode junction potential drops, while the circuit through 4*b*–4*e* and diodes 9 and 19 provides three diode junction potential drops to base 5*b*. Thus collector 5*c*, which is connected to output terminal 8, is held at the same potential as base 5*b*, and saturation of transistor 5 is avoided.

The third mode of operation relates to the release of stored charge carriers from the clamping diodes and base of transistor 4. It may be seen that when previous stage 2 suddenly operates, point A is clamped to two diode threshold drops above ground. At this instant, charge carriers stored in the base of transistor 4 and the clamping diodes 10, 11 and 20 would ordinarily force the base 4*b* to be at a potential sufficiently above ground to keep transistor 4 and therefore the remainder of the inverter stage in operation, until the charge carriers have leaked to ground. This has been the problem with the prior art circuits as described with reference to FIG. 1.

In the embodiment of my invention shown in FIG. 6, diode 22 is connected with opposite polarity and in parallel with diode 21. Since the charge carriers present at the junction of the base electrode 4*b* and the clamping diodes is sufficient to maintain the remainder of the inverter circuit operated, it may be seen that they easily maintain diode 22 forward biased, since diode 22 is connected in a direction which allows it to become forward biased by these charge carriers through input diode 1(*a*) and previous stage 2. The charge carriers quickly flow through this low impedance circuit to ground. After shut-off of the inverter stage, any remaining charge carriers leak to ground through high impedances of diodes below forward conduction threshold, but this does not affect the effective propagation delay of the circuit.

The anode of diode 22 is only 3 diode junction drops from ground through the input diode 1(*a*) and the previous stage 2, while through transistors 4 and 5 and diodes 9 and 19 there are 4 diode junction drops to ground. Once the stored charge carriers have been conducted to ground via diode 22, diode 1(*a*) and previous stage 2 sufficient to allow diode 22 to cease being forward biased, the inverter stage shuts off since the base 4*b* is then below the forward biasing potential required for the transistors 4 and 5 and diodes 9 and 19 to conduct.

It is important to note that the conduction to ground via a path leading through diode 22 is through a very low impedance, and therefore the charge carriers discharge extremely rapidly and thus the inverter stage is turned off very quickly, while in the prior art charge carriers leaked to ground through high impedance junctions, keeping the inverter stage operated during the long leak interval. This embodiment will operate properly provided between ground and the junction point of the clamp diodes and the base 4*b* of transistor 4 through the diode 22 and the AND stage, there are fewer diode junction drops than from ground through transistor 5 and the level shifting diodes 19 and 9 and transistor 4 to the junction of the clamp diodes and base 4*b*.

In addition, other diodes may be connected in series combinations with diode 21 in order to achieve still higher noise immunity characteristics of the inverter circuit.

The value of resistor 6 may be 750 ohms, resistor 3 may be 1,500 ohms, and +V operating potential may be 5 volts to ground. All diodes and transistors may be made of silicon, with characteristics to suit the circuit characteristics desired by the manufacturer.

A diode of the level shifting means, for instance diode 9, may be produced as a transistor in order to achieve higher gain in the inverter stage. A schematic diagram showing an example of this embodiment may be seen in FIG. 7. FIG. 7 is similar to FIG. 6 except for the aforementioned change.

Diode 9 is replaced in FIG. 7 by a third transistor means shown as transistor 23 having base 23*b*, collector 23*c* and emitter 23*e*. The transistor 23 is connected in emitter follower configuration in this embodiment, forming with transistor 4 what is commonly referred to as a Darlington Pair. The base 23*b* is connected to the emitter 4*e*, and the collector 23*c* is connected to the collector 4*c*. The emitter 23*e* is connected to the anode of diode 19. As may be seen, the transistor 23 is of the same conductivity type as transistors 4 and 5, shown here as NPN. The diode junction 23*b*–23*e* replaces the diode junction 9 in FIG. 5, and is connected in the direction of easy current flow with transistors 4 and 5, and diode 19. A resistor 24 is connected between emitter 4*e* and ground, to guarantee against the leakage current across 4*c*, 4*e*, of transistor 4 operating the following transistors 23 and 5.

The operation of the circuit is similar to that of FIG. 6 except that there is greater amplification within the inverter stage due to the added transistor.

Although the principles of this invention have been described with reference to diodes and transistors having the same types of material it will be obvious to those understanding this invention that its principles may be utilized with combinations of germanium and silicon or other structural materials for the diodes and transistors. Diodes having multiple junctions may be used to achieve threshold levels, various modes of biasing may be used or transistors connected as diodes may be used where applicable by those understanding my invention and utilizing its principles.

What is claimed is:

1. A logic inverter circuit comprising;

(a) an input terminal, (b) first transistor means having an input electrode which is connected to the input terminal, (c) an output terminal, (d) second transistor means having an output electrode which is connected to the output terminal, (e) means for applying operating potential to the inverter circuit, (f) level shifting means connecting the first transistor means to the second transistor means to form a first series circuit having a predetermined conduction threshold, and (g) clamping means connecting said input electrode to said output electrode for maintaining the second transistor means at a predetermined operating point while it is conducting, whereby charge carriers which may be stored in the clamping means are rapidly conducted to the input terminal when the first series circuit is not conducting in its forward direction.

2. A logic inverter circuit comprising:

(a) an input terminal, (b) a first transistor comprising a first base electrode and a first emitter electrode, (c) an output terminal, (d) a second transistor of the same conductivity type as the first transistor comprising a second base electrode, a second emitter electrode, and a second collector electrode, having its collector electrode connected to the output terminal, (e) means for connecting a load to the output terminal, (f) means for applying operating potential to the inverter circuit, (g) clamping means for establishing an operating point for said second transistor while it is conducting, connecting the second collector electrode to the first base electrode, and (h) first diode level shifting means having a predetermined number of diode junctions connecting the first emitter electrode and the second base electrode in the direction of easy current flow, forming a first series circuit with the first base-first emitter junction and the second base-second emitter junction, and (i) means interconnecting the input terminal with the first base electrode for rapidly conducting charge carriers, which may be stored in the clamping means, to the input terminal when the first series circuit is not conducting in its forward direction.

3. A logic inverter circuit as defined in claim 2 wherein the level shifting means comprises a transistor amplifier.

4. A logic inverter circuit as defined in claim 2 wherein the clamping means comprises second diode means having a fewer number of diode junctions than the total number of diode junctions in said series circuit including the base-emitter diode junctions of said transistors.

5. A logic inverter circuit as defined in claim 1, comprising switching means connected to the input terminal for switching the operating potential which may be present at said terminal to below the operating threshold potential of said first series circuit.

6. A logic circuit as defined in claim 2 further comprising at least one input diode having its similar pole to that of the base emitter diode of the first transistor connected to said input terminal.

7. A logic inverter circuit comprising:

(a) an input terminal, (b) a first transistor comprising a first base electrode and a first emitter electrode, (c) an output terminal, (d) a second transistor of the same conductivity type as the first transistor comprising a second base electrode, a second emitter electrode, and a second collector electrode, having its collector electrode connected to the output terminal, (e) means for connecting a load to the output terminal, (f) means for applying operating potential to the inverter circuit,
(g) clamping means for establishing an operating point for said second transistor while it is conducting, connecting the second collector electrode to the first base electrode, and
(h) first diode level shifting means having a predetermined number of diode junctions connecting the first emitter electrode and the second base electrode in the direction of easy current flow, forming a first series circuit with the first base-first junction and the second base-second emitter junction, and
(i) a second level shifting means connected between the first transistor means base electrode and the input terminal, and bypass means connected in a parallel with the second level shifting means for allowing charge carriers which may be stored in the clamping means to be conducted to the input terminal when said series circuit is not conducting in its forward direction.

8. A logic inverter circuit comprising:
(a) an input terminal,
(b) a first transistor comprising a first base electrode and a first emitter electrode, having its base electrode connected to the input terminal,
(c) an output terminal,
(d) a second transistor of the same conductivity type as the first transistor comprising a second base electrode, a second emitter electrode, and a second collector electrode, having its collector electrode connected to the output terminal,
(e) means for connecting a load to the output terminal.
(f) means for applying operating potential to the inverter circuit,
(g) clamping means for establishing an operating point for said second transistor while it is conducting, connecting the second collector electrode to the first base electrode, and
(h) first diode level shifting means having a predetermined number of diode junctions connecting the first emitter electrode and the second base electrode in the direction of easy current flow, forming a first series circuit with the first base-first emitter junction and the second base-second emitter junction,
(i) wherein the clamping means comprises second diode means having a few number of diode junctions than the total number of diode junctions in said series circuit including the base-emitter diode junctions of said transistors,
(j) a second diode level shifting means connected between the first transistor means base electrode and the input terminal, and
(k) a diode bypass means connected in parallel with said level shifting means, but with opposite polarity.

9. A logic inverter circuit comprising:
(a) an input terminal,
(b) a first transistor comprising a first base electrode and a first emitter electrode,
(c) an output terminal,
(d) a second transistor of the same conductivity type as the first transistor comprising a second base electrode, a second emitter electrode, and a second collector electrode connected to the output terminal,
(e) means for connecting a load to the output terminal,
(f) means for applying operating potential to the inverter circuit,
(g) clamping means for establishing an operating point for said second transistor while it is conducting, connecting the second collector electrode to the first base electrode, and
(h) first diode level shifting means having a predetermined number of diode junctions connecting the first emitter electrode and the second base electrode in the direction of easy current flow, forming a first series circuit with the first base-first emitter junction and the second base-second emitter junction,
(i) wherein the clamping means comprises a second diode means having a fewer number of diode junctions than the total number of diode junctions in said series circuit including the base-emitter diode junctions of said transistors,
(j) a second diode level shifting means connected between the first base and the input terminal and
(k) a diode bypass means connected in parallel with second diode level shifting means, but with opposite polarity; said diode level shifting means comprising a series aiding circuit of two semiconductor diodes, and said clamping means comprising a second series circuit of 3 diodes poled in the same direction as said first series circuit between the first base electrode and the second collector electrode.

10. A logic inverter as defined in claim 9 further comprising switching means for switching the operating potential which may be present at the input terminal to below the operating threshold potential of said first series circuit.

11. A logic inverter circuit as defined in claim 9 further comprising at least one input diode having its like pole to that of the second diode level shifting means connected to said input terminal.

12. A logic inverter circuit as defined in claim 4 further comprising a first resistive means connected between the input terminal and a first pole of the means for applying operating potential, at least one input diode connected to said input terminal with the same pole as that of the base-emitter diode of the first transistor, and a second resistive means connected between the second base electrode and the opposite pole of the means for applying potential; the first diode means comprising a semiconductor diode, and said clamping means comprising a second series circuit of two semiconductor diodes poled in the same direction as said first series circuit between the first base electrode and the second collector electrode; the first transistor means further comprising a first collector electrode, the first pole of the means for connecting operating potential being connected to the first collector electrode and the means for connecting a load, the opposite pole of the means for connecting operating potential being connected to the second emitter electrode.

13. A logic inverter circuit as defined in claim 11 wherein the first transistor comprises a first collector electrode; further comprising a first resistive means having one termianl connected to the input terminal, and a second resistive means connected between the second base electrode and the second emitter electrode; the other terminal of said first resistive means, the first collector electrode and the means for connecting the load being all connected to the first pole of a means for connecting a source of operating potential, the second emitter being connected to the other pole of the means for connecting a source of operating potential.

14. A logic inverter circuit as defined in claim 12 further comprising a transistor switching means connected between the other pole of the input diode and the opposite pole of the means for connecting operating potential.

15. A logic inverter circuit comprising:
(a) an input terminal,
(b) a first transistor comprising a first base electrode and a first emitter electrode,
(c) an output terminal,
(d) a second transistor of the same conductivity type as the first transistor for comprising a second base electrode, a second emitted electrode, and a second collector electrode, having its collector electrode connected to the output terminal, (e) means for connecting a load to the output terminal, (f) means for applying operating potential to the inverter circuit, (g) clamping means for establishing an operating point for said second transistor while it is conducting, connecting the second collector electrode to the first base electrode, and (h) first diode level shifting means having a predetermined number of diode junctions connecting the first emitter electrode and the second base electrode in the direction of easy current, forming a first series circuit with the first base-first emitter junction and the second-base-second emitter junction, (i) wherein the clamping means comprising second diode means having a fewer number of diode junctions than the total number of diode junctions in said series circuit including the base-emitter diode junctions of said transistors, (j) a second diode level shifting means connected between the first base and the input terminal, and a diode bypass means connected in parallel with said level shifting means, but with opposite polarity;

(k) said first diode level shifting means comprising a third transistor of the same conductivity type as the first transistor means and having a third base electrode, a third emitter electrode, and third collector electrode; and a semiconductor diode connected in series aiding relationship with the third emitter electrode and second base electrode, the third base electrode being connected to the first emitter electrode; said clamping means comprising a second series circuit of 3 diodes poled in the same direction as said first series circuit between the first base electrode and second collector electrode; a first resistive means having one terminal connected to the input terminal, a second resistive means connected between the second base electrode and a third resistive means having one terminal connected to the third base electrode; the first transistor means further comprising a first collector electrode; the other terminal of said resistive means, the first collector electrode, the third collector electrode and the means for connecting the load being all connected to the first pole of a means connecting a source of operating potential, the second emitter and the other terminal of the third resistive means being connected to the other pole of the means for connecting a source of operating potential.

16. A logic inverter circuit as defined in claim 1 including a semiconductor AND stage connected to the input terminal.

17. A logic inverter circuit as defined in claim 2 comprising switching means connected to the input terminal for switching the operating potential which may be present at said terminal to below the operating threshold potential of said first series circuit.

References Cited

UNITED STATES PATENTS

| | | | |
|---|---|---|---|
| 3,209,214 | 9/1965 | Murphy et al. | 307—215 X |
| 3,217,181 | 11/1965 | Zuk | 307—215 |
| 3,265,906 | 8/1966 | Feller | 307—214 |
| 3,283,180 | 11/1966 | Pressman | 307—215 |
| 3,394,268 | 7/1968 | Murphy | 307—215 |

JOHN S. HEYMAN, Primary Examiner

U.S. Cl. X.R.

307—213, 214, 237, 319